(12) United States Patent
Melava et al.

(10) Patent No.: US 6,583,674 B2
(45) Date of Patent: Jun. 24, 2003

(54) FRACTIONAL MULTIMODULUS PRESCALER

(75) Inventors: Jari Melava, Salo (FI); Mikael Svärd, Andersböle (FI)

(73) Assignee: Nokia Mobile Phones Ltd, Espoo (FI)

( * ) Notice: Subject to any disclaimer, the term of this patent is extended or adjusted under 35 U.S.C. 154(b) by 0 days.

(21) Appl. No.: 09/802,610

(22) Filed: Mar. 9, 2001

(65) Prior Publication Data

US 2001/0022537 A1 Sep. 20, 2001

(30) Foreign Application Priority Data

Mar. 10, 2000 (FI) .................................. 000570

(51) Int. Cl.[7] .............................................. H03L 7/00
(52) U.S. Cl. ............................ 331/16; 327/115; 377/48
(58) Field of Search .......................... 377/47, 48, 118, 377/43, 49; 331/16; 327/115, 117, 118, 156

(56) References Cited

U.S. PATENT DOCUMENTS

| | | | |
|---|---|---|---|
| 4,573,176 A | 2/1986 | Yeager | 377/48 |
| 4,586,005 A | 4/1986 | Crawford | 331/1 A |
| 4,891,774 A | 1/1990 | Bradley | 364/703 |
| 5,394,116 A * | 2/1995 | Kasturia | 331/34 |
| 5,576,666 A | 11/1996 | Rauvola | 331/25 |
| 5,714,896 A * | 2/1998 | Nakagawa et al. | 327/115 |
| 5,970,110 A | 10/1999 | Li | 377/48 |

OTHER PUBLICATIONS

"A 1.75–GHz/3–V Dual–Modulus Divide–by–128/129 Prescaler in 0.7 um CMOS", Craninckx, et al., IEEE Journal of Solid–State Circuits, vol. 31, No. 7, 1996.

* cited by examiner

*Primary Examiner*—Robert Pascal
*Assistant Examiner*—Joseph Chang
(74) *Attorney, Agent, or Firm*—Perman & Green, LLP

(57) ABSTRACT

A prescaler is used for generating an output frequency from an input frequency by fractional division. It comprises a component signal composer (402) arranged to generate a number of parallel component signals that differ in phase from each other. Additionally it comprises a controllable phase selector (403) arranged to respond to a control signal by either selecting a constant number of unchanged ones of the parallel component signals or to repeatedly change its selection among the parallel component signals. The component signal composer (402) is arranged to generate more than four parallel component signals for the phase selector (403) to choose from.

16 Claims, 5 Drawing Sheets

FRACTIONAL MULTIMODULUS PRESCALER

TECHNOLOGICAL FIELD

The invention concerns generally the technology of converting electric signals oscillating on a certain relatively high frequency into certain other electric signals oscillating on a certain different relatively high frequency. Especially the invention concerns the use of a fractional prescaler with multiple divisor numbers for the above-mentioned purpose.

BACKGROUND OF THE INVENTION

FIG. 1 illustrates a known circuit topology for generating oscillating signals with a certain predefined frequency. The circuit topology is known as one embodiment of the PLL or phase-locked loop concept. The component which generates the actual oscillating output signal $f_{out}$ is a VCO or voltage-controlled oscillator 101. From the output there is a feedback connection to a prescaler 102 which converts the oscillating output signal $f_{out}$ into another oscillating signal $f_{div}$ with a lower frequency. To be exact, the frequency of the oscillating signal $f_{div}$ is a fraction of that of the oscillating output signal $f_{out}$, i.e. the prescaler 102 divides the signal $f_{out}$ with a certain divisor or modulus. The lower frequency signal $f_{div}$ is fed into a phase detector 103 together with a very stable reference frequency $f_{ref}$. The phase detector 103 gives a difference signal which depends on the phase difference between its input signals $f_{div}$ and $f_{ref}$. This difference signal is filtered in a low-pass type loop filter 104 to get a control voltage signal to the VCO 101. A mode selection signal Mode coupled to the prescaler 102 determines the divisor to be used. A typical known prescaler type is the so-called dual modulus prescaler where the mode selection signal Mode has two allowed values so that when the mode selection signal has its first value a divisor N is used and when the mode selection signal has its second value a divisor N+1 is used.

FIG. 2 illustrates a known conventional dual-modulus prescaler architecture. It consists of a first divider 201 known as the synchronous divider and a second divider 202 known as the asynchronous divider as well as of some logical gates. Each divider comprises a chain of D-flip-flops. Note that in order to preserve consistency with FIG. 1 there appears a signal $f_{out}$ which is the input signal of the prescaler while its output is denoted as $f_{div}$.

The synchronous divider 201 operates at full frequency, which means that all three flip-flops 203, 204 and 205 are clocked by the input signal $f_{out}$ the frequency of which may be in the order of hundreds of MHz. Most of the time the mode selection signal Mode is low so the intermediate frequency $f_{int}$ on line 206 is determined by the loop of the first two flip-flops 203 and 204 in the synchronous divider 201. During such times $f_{int}=f_{out}/4$, and since the effect of the asynchronous divider 202 is to divide $f_{int}$ by 32, the prescaler implements a divide-by-128 function, i.e. $f_{div}=f_{out}/128$. When the mode selection signal Mode is high and all Q-outputs from the flip-flops of the asynchronous divider 202 go high simultaneously, the control signal Ctrl on line 207 goes also high and the loop in the synchronous divider 201 is momentarily closed over three flip-flops instead of two, causing an extra delay which is equivalent to dividing by five. When the prescaler divides once by five and 31 times by four, the net effect is a division by 129, i.e. $f_{div}=f_{out}/129$.

The problem of the prescaler of FIG. 2 is that there are three fully functional D-flip-flops which must be continuously clocked with full frequency. Taken that CMOS technology is used for hardware implementation, a total of three D-flip-flops clocked at a very high frequency presents a substantial drain of current and a serious load to the output of the VCO in the arrangement of FIG. 1.

From the publication J. Craninckx, M. S. J. Steyaert: "A 1.75-GHz/3-V Dual-Modulus Divide-by-128/129 Prescaler in 0.7 μm CMOS", IEEE Journal of Solid-State Circuits, Vol. 31, No. 7, July 1996, which is incorporated herein by reference, there is known the dual-modulus prescaler architecture illustrated in FIG. 3. Here an input signal $f_{out}$ to the prescaler and its complementary differential pair $\overline{f_{out}}$ are fed into a divide-by-2 flip-flop 301. The resulting differential pair of signals F2 and $\overline{F2}$ are once again divided by two in a second divide-by-2 flip-flop 302 which is of the known master/slave type so that it gives four output signals each of which has the frequency of one quarter that of the original frequency $f_{out}$. The four output signals from the second divide-by-2 flip-flop 302 have mutual phase differences of π/2 radians so that they may be designated as F4,I; F4,Q; $\overline{F4,I}$ and $\overline{F4,Q}$. They are coupled to the four input terminals of a phase selector block 303 which is just a controllable selection switch which couples one of its input signals at a time to its output. The output F4 of the phase selector block 303 is coupled to a further divide-by-32 block 304 the output of which is the output signal $f_{div}$ of the prescaler.

A frequency control block 305 commands the phase selector block 303 to either simply connect one of its input signals constantly to its output or to change the selection of input signal. Most of the time the frequency control block 305 is disabled so that the prescaler implements a divide-by-128 function, i.e. $f_{div}=f_{out}/128$. When the mode selection signal Mode is high, the NAND gate 306 activates the frequency control block 305 so that on every positive edge of the output signal $f_{div}$ the control signal Ctrl instructs the phase selector block 303 to pick the next input signal. This causes in the signal F4 a delay which is exactly enough to result in an overall effect according to which the prescaler now implements a divide-by-129 function, i.e. $f_{div}=f_{out}/129$.

The advantage of the prescaler of FIG. 3 over that of FIG. 2 is that there is only one flip-flop to be driven at the full clock frequency, which means a considerably lighter load to the output of the VCO in a PLL application and consumes much less power. However, the prescaler of FIG. 3 is rather inflexible in that only two divisors can be used. Additionally it gives rise to a very harmful spike effect which means that if the transition in changing input signals in the phase selector block 303 is too fast, an unwanted transient negative voltage spike appears in the output signal of the phase selector block 303. The authors of the reference publication propose that the spike should be eliminated by buffering a part of the control signal which controls the phase selection. To be exact, the authors suggest that a very small buffer inverter should be used to steer the control signals in order to limit their slope.

SUMMARY OF THE INVENTION

It is an object of the invention to present a prescaler architecture which enables the construction of high-speed multimodulus prescalers with low power consumption and applicability in very high clocking frequencies. An additional object of the invention is to present a prescaler architecture where the above-mentioned spike effect does not appear.

The objects of the invention are achieved by dividing an oscillating input signal into a multitude of component signals which differ in phase from each other, and using a flexibly controlled phase selector unit to compose various combinations from the component signals.

The prescaler according to the invention comprises a component signal composer arranged to generate a number of parallel component signals that differ in phase from each other and a controllable phase selector arranged to respond to a control signal by either selecting a constant number of unchanged ones of the parallel component signals or to repeatedly change its selection among the parallel component signals;

it is characterized in that the component signal composer is arranged to generate more than four parallel component signals for the phase selector to choose from.

The invention applies also to a frequency synthesizer which is characterized in that it comprises a prescaler of the above-defined kind.

Additionally the invention applies to a method for generating an output frequency from an input frequency, comprising the steps of generating, on the basis of the input frequency, a number of parallel component signals that differ in phase from each other and controllably either selecting a constant number unchanged ones of the parallel component signals or repeatedly switching the selection among the component signals;

the method according to the invention is characterized in that the step of generating a number of parallel component signals comprises the substep of generating more than four parallel component signals.

According to the present invention, a great degree of flexibility can be added to the known phase selection principle if the number of available component signals is increased from four. In a prescaler according to the invention a controllable phase selector has more than four component signals of different phase to choose from. Most advantageously it is also capable of realizing other switching modes than just picking the next component signal in the order of ascending or descending phase. This way a multitude of fractional divisions, even with non-integer dividers, can be achieved in a single hardware component.

In order to enable the controlled selection of component signal combinations in the phase selector a more advanced controlling scheme is needed than the on-off type mode selection signal in the known prescalers. An advantageous form of realising the controlling functionality is to couple the actual phase selector into a control block which accepts a digital code word as its input and converts different bit combinations in an inputted digital code word into control signals for the phase selector. One of the inputs of the control block is typically a feedback connection from the output parts of the prescaler in order to synchronize the controlled phase selection with transitions in the output signal of the prescaler.

The phase selector proper is most advantageously implemented as a differential multiplexer where each component signal drives a switch of its own so that the complementary components of the same differential input signal pair drive parallel switches which are additionally coupled in series with a common control switch for that differential input signal pair. A first loaded supply voltage rail is common to all I-phase component signals and a second loaded supply voltage rail is common to all Q-phase component signals. A common bias can be used for all switching branches. The outputs of the multiplexer are obtained from the loaded supply voltage rails.

BRIEF DESCRIPTION OF THE DRAWINGS

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

FIGS. 1, 2 and 3 have been described within the description of prior art, so the following discussion of the invention and its advantageous embodiments focuses on FIGS. 4 to 10. Same reference designators are used for similar part in the drawings.

DETAILED DESCRIPTION OF THE INVENTION

Figure 1:
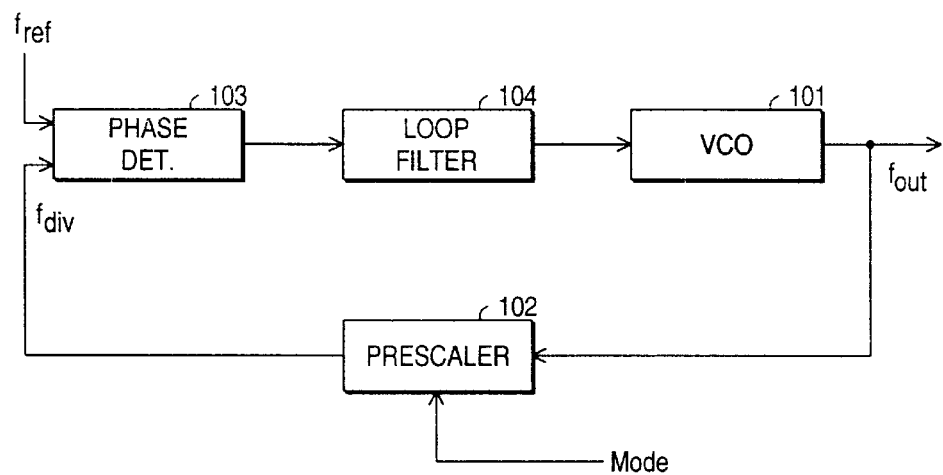
FIG. 1 illustrates a known embodiment of a phase-locked loop.
Figure 2:
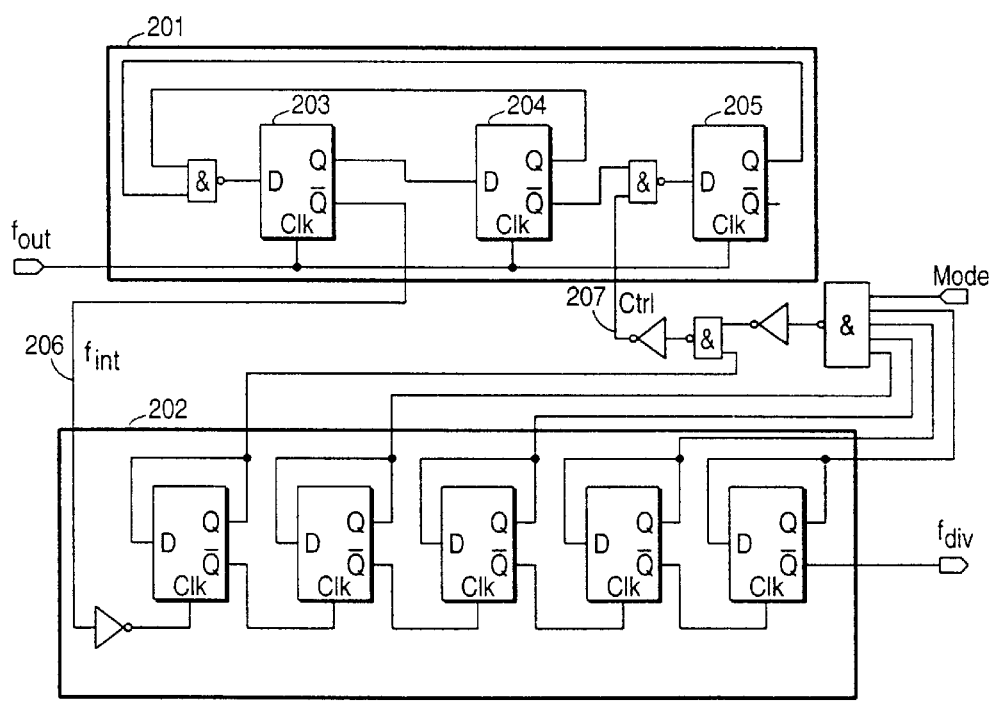
FIG. 2 illustrates a first known prescaler.
Figure 3:
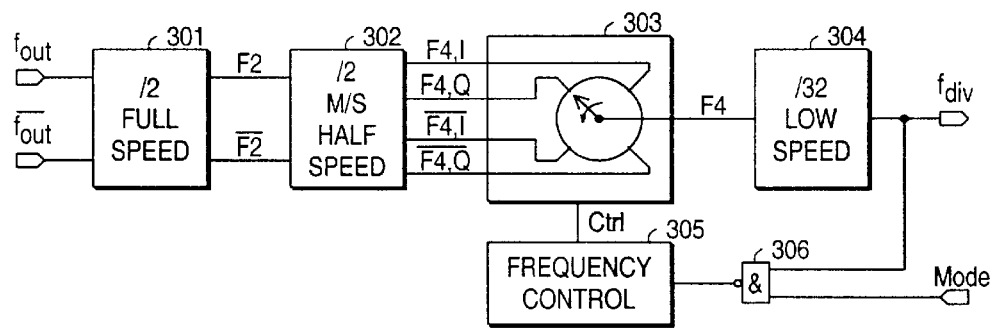
FIG. 3 illustrates a second known prescaler.
Figure 4:
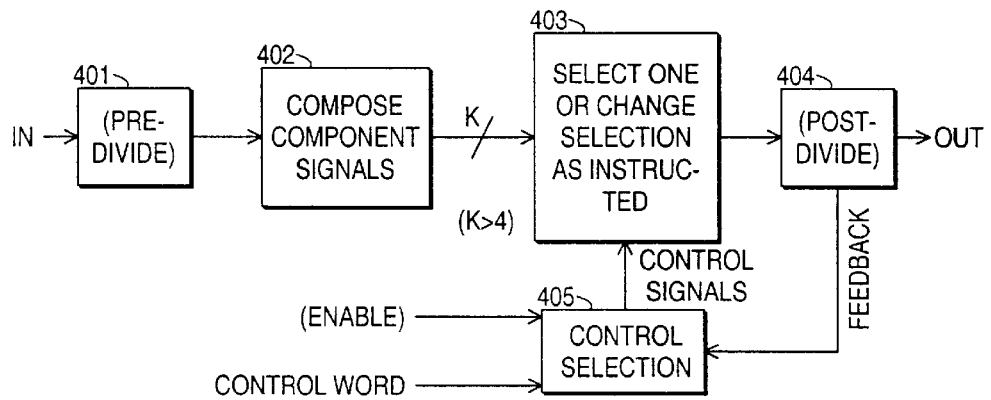
FIG. 4 illustrates the principle of the invention.

FIG. 4 shows the functional principle of a prescaler according to the present invention. An input signal may first be predivided in a predivider block 401, although this is not obligatory. A component signal composer block 402 converts the input signal into K component signals, where K is greater than 4. Most advantageously there is an even number of component signals so that they constitute a number of differential signal pairs where the component signals in each pair are the complementary components of each other. Additionally the practical implementations and calculatory analyses are at their simplest if the component signals constitute a closed set of signals where the phase difference between adjacent signals in the set is constant; the last signal in the set is considered to be adjacent to the first one. However, the invention does not require that there should always be an even number of component signals, or that the component signals should consist of differential pairs, or that the component signals should constitute a closed set of signals where the phase difference between adjacent signals in the set is constant.

The component signals are fed into a phase selector block 403 which in a wide sense is a multiplexer, i.e. a controllable selection switch which couples at least one of its input signals at a time to its output. The phase selector 403 being a multiplexer in a wide sense means that it can also perform combinatory functions, i.e. couple at least two of its input signals simultaneously to its output. Such combinatory functions serve the purpose of generating into the output of the phase selector block 403 a signal the phase of which is different from the phase of any single component signal.

The output of the phase selector block 403 may be coupled directly to the output of the prescaler, or it can be coupled to a post-divider 404 as in FIG. 4 in order to lower the frequency of the signal further before outputting it from the prescaler. For example typical PLL applications require that the output frequency of the prescaler is at most approximately one hundreth of the output frequency of the VCO from the output of which the signal to the prescaler is taken, and such large divisions are difficult to obtain with only a component signal composer block 402 and a phase selector block 403.

The operation of the phase selector block 403 is controlled by a control block 405. Typical controlling consists of commands to either pick one (or a few) of the component signals and keep coupling it (them) to the output of the phase selector, or to perform certain regular or pseudo-random changes where the component signal(s) to be coupled to the output of the phase selector is/are repeatedly changed. In order to synchronize the controlled changes in selected component signal(s), the control block 405 receives feedback from the post-divider 404 in FIG. 4. The invention does not limit the selection of point within the post-divider 404 from which the feedback signal is taken: it can come either from a constant location (e.g. from the output of the post-divider, which is the output proper of the whole prescaler) or there may be a controllable switch within the post-divider 404 which picks the feedback signal from different locations of the post-dividing process according to some switching instructions.

In FIG. 4 the control block 405 has two additional inputs, of which the Enable input switches the controlling function either on or off, and the Control Word input tells the control block the switching mode which the phase selector should currently implement. It is not necessary to have two separate inputs for these purposes, since it is easy to define that a certain value of the control word brought into a single Control Word input serves to switch off the whole controlling function. Switching off the controlling function means that the phase selector 403 should not perform any changes but just pick one (or a few) of the component signals and keep coupling it (them) constantly to the output of the phase selector.

Figure 5:
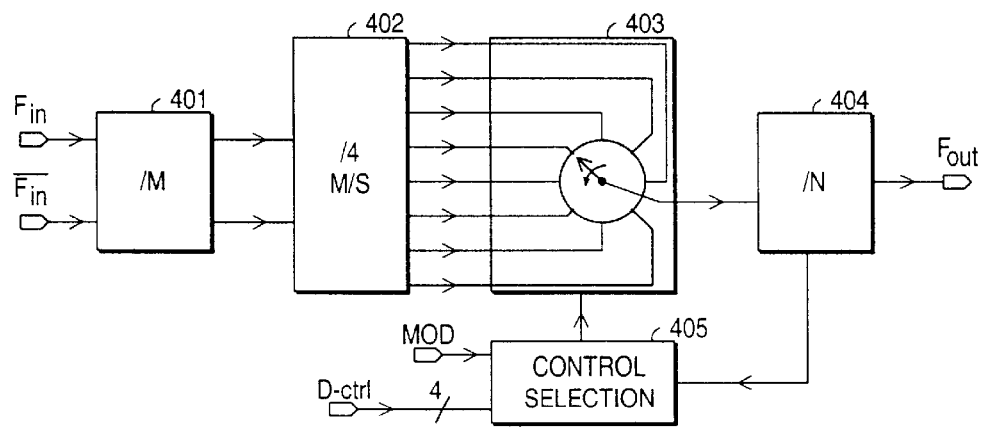
FIG. 5 illustrates a prescaler according to an embodiment of the invention.

FIG. 5 illustrates a more detailed embodiment of the invention where especially the value for the parameter K appearing in FIG. 4 is selected to be eight. Note that in order to illustrate the general applicability of the invention, FIG. 5 has been separated from the PLL context by denoting the (differential) input signal of the prescaler as $F_{in}$ and the output signal of the prescaler as $F_{out}$. The predivider 401 is shown to have a divisor M, which can be e.g. 1 (meaning no division at all) or 2. The larger the divisor in the predivider, the more load the prescaler input tends to impose to the component providing the signal $F_{in}$ (not shown in FIG. 5), so it is usually advantageous to keep the divisor M rather small. The component signal composer block 402 is arranged to produce eight component signals the mutual phases of which are illustrated by the location of the endpoints of the corresponding signal lines in the selection circle of the phase selector block 403. To be exact, the eight component signals shown in FIG. 5 are located at regular intervals in phase space so that the phase difference between adjacent component signals is $\pi/4$. Another way to define this particular set of component signals is to say that it consists of four differential signal pairs where the phase difference from the n:th differential signal pair to the n+1:th is $\pi/4$, n getting the positive integral values of 1 to 3.

The phase selector block 403 operates according to the definition given above within the description of FIG. 4. The output signal thereof is coupled to the post-divider 404, which is here shown to have a divisor N. The output signal $F_{out}$ of the post-divider 404 is the output signal of the whole prescaler. There is a feedback connection from the post-divider 404 to the control block 405, which also receives as its inputs a one-bit enabling signal MOD and a four-bit digital control word D-ctrl. Sixteen possible component signal selection schemes can be selected through the use of a four-but code word. It is on the responsibility of the control block 405 to translate the codewords into actual switching commands comprehensible to the phase selector 403 and to synchronize these commands with the feedback obtained from the post-divider 404.

Figure 6:
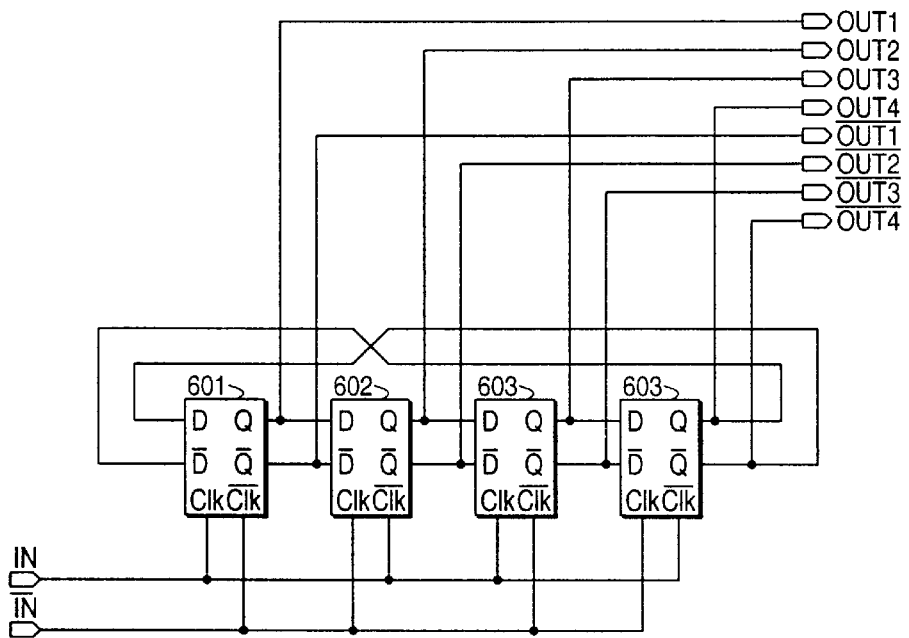
FIG. 6 illustrates a component signal composer according to an embodiment of the invention.

FIG. 6 shows a possible flip-flop-level implementation for the component signal composer block 402 when it is used to produce eight component signals at regular phase difference intervals of $\pi/4$. The circuit consists of four D-flip-flops 601, 602, 603 and 604 in a master-slave configuration where the polarity of a differential input signal IN/$\overline{\text{IN}}$ is reversed every time between adjacent flip-flops before coupling it to the differential clock inputs of the flip-flops. The outputs of each flip-flop are coupled to the inputs of the next flip-flop directly except in coupling the outputs of the fourth flip-flop to the inputs of the first flip-flop where the polarity is reversed. The differential output signal pairs are obtained from the outputs of the D-flip-flops 601, 602, 603 and 604. The reversed polarity of the clocking input signal between adjacent flip-flops and the total number 4 of the flip-flops causes the output phase difference between adjacent flip-flops to be $\pi/4$.

The structure illustrated in FIG. 6 is not the only possible solution for generating the eight component signals described above. The master-slave arrangement of D-flip-flops as such is only applicable to the generation of $2^p$ component signals where the exponent p is a positive integer greater than one. It is well within the capabilities of a person skilled in the art to present implementations for the generation of e.g. 6 component signals with mutual phase differences of $\pi/3$, or 10 component signals with mutual phase differences of $\pi/5$. Slightly more complicated arrangements are required for the generation of odd numbers of component signals, but also they are considered to be within the capabilities of a person skilled in the art.

Figure 7:
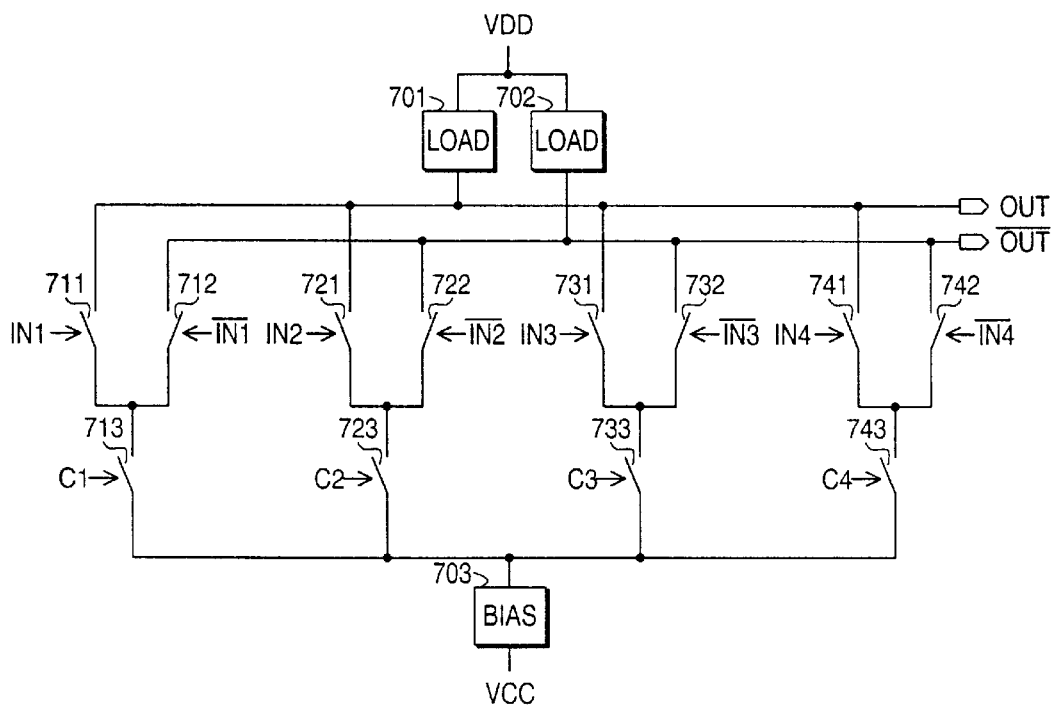
FIG. 7 illustrates a multiplexer according to an embodiment of the invention.

FIG. 7 shows a possible implementation for the phase selector block 403 when it is used for switching between eight input signals grouped into four differential input signal pairs. The phase selector or multiplexer circuit of FIG. 7 consists of parallel switching branches which are coupled between a pair of loaded supply voltage rails and a bias rail. Loading blocks 701 and 702 serve to provide voltage swing to the loaded voltage rails when selected ones of the switches are closed, and the biasing block 703 creates the current needed for the operation of the circuit. The symbols VDD and VSS denote positive and negative operating voltages respectively.

In each switching branch of FIG. 7 there are three controllable switches of which two are in parallel and one is in series with the pair of parallel switches. As an example we consider the leftmost switching branch in FIG. 7 where an input signal IN1 is arranged to close and open the first one 711 of the parallel switches and its complementary differential pair $\overline{\text{IN1}}$ is arranged to close and open the second one 712 of the parallel switches. A control signal C1 is arranged to close and open the serially coupled switch 713. In the other switching branches the switches 721, 731 and 741 are controlled by the input signals IN2, IN3 and IN4 respectively and the switches 722, 732 and 742 are controlled by their complementary differential pairs $\overline{IN2}$, $\overline{IN3}$ and $\overline{IN4}$ respectively. The serially coupled switches 723, 733 and 743 are controlled by control signals C2, C3 and C4 respectively. In each switching branch one of the parallel switches is coupled to the first loaded voltage rail and the other is coupled to the second loaded voltage rail. That end of the serially coupled switch in each switching branch which is not coupled to the parallel pair of switches in that switching branch is coupled to the bias rail. The switches are typically solid-state semiconductor switches based on e.g. BJT (Bipolar Junction Transistor), MOSFET (Metal Oxide Semiconductor Field Effect Transistor), MESFET (Metal Semiconductor Field Effect Transistor) or HBT (Heterojunction Bipolar Transistor) technologies or some other technologies.

Let us first assume that only one of the control signals C1, C2, C3 and C4 is active at a time and the active control signal does not change. The effect of an active control signal is to close the corresponding serially coupled switch so that the alternating switching functions caused by the corresponding input signal pair in the corresponding parallel pair of switches causes the corresponding differential input signal pair to be copied into the output lines OUT and $\overline{OUT}$. In a stationary phase selection state, where the operation of the control block 405 is disabled, this is exactly what happens. For the operation of the prescaler it is not essential to know, which one of the differential input signal pairs goes through the phase selector block 403 in a stationary phase selection state. The divisor by which the prescaler divides its input frequency is then M×4×N, i.e. $F_{out}=F_{in}/(M\times 4\times N)$.

Let us then assume that still only one of the control signals C1, C2, C3 and C4 is active at a time but the active control signal changes in a regular rotational order so that C2 becomes active after C1 and so on; C1 becomes active again after C4. Taken that the input signals are arranged in the manner described above, i.e. IN1 is π/4 radians ahead of IN2, which is π/4 radians ahead of IN3, which is π/4 radians ahead of IN4, the effect of each change in the active control signal is to cause the phase of the output signal to decline by π/4 radians. If the rotational order of the changes in active control signal is reversed, the effect of each change in the active control signal is to cause a phase advance of π/4 radians in the output signal. Regular rotational changes in the active control signal thus effectively cause the frequency of the output signal to shift from the value which it had when the control signal did not change, which as a whole is synonymous to using a different divisor than M×4×N in the prescaler.

Before analyzing the obtainable values of the divisor in the prescaler in more detail, we may consider a case where exactly two control signals are active at a time in the multiplexer of FIG. 7. For the sake of simplicity we may assume that the input and output signals are sinusoidal oscillations, i.e.

$$IN1(t) = A\sin(\omega t)$$
$$\overline{IN1}(t) = A\sin(\omega t - \pi)$$
$$IN2(t) = A\sin\left(\omega t - \frac{\pi}{4}\right)$$
$$\overline{IN2}(t) = A\sin\left(\omega t - \frac{5\pi}{4}\right)$$

where t denotes time, A is a constant amplitude factor and ω is the inverse of the input signal frequency. Setting control signals C1 and C2 active simultaneously means that the output signal OUT is the sum of input signals IN1 and IN2, and the complementary differential output signal $\overline{OUT}$ is the sum of the input signals $\overline{IN1}$ and $\overline{IN2}$. For the output signal OUT $$IN1(t) + IN2(t) = A\left(\sin(\omega t) + \sin\left(\omega t - \frac{\pi}{4}\right)\right)$$
$$= 2A\cos\left(\frac{\pi}{8}\right)\sin\left(\omega t - \frac{\pi}{8}\right)$$

as can be shown by simple trigonometric calculus. For the complementary differential output signal $\overline{OUT}$ a similar calculation gives a similar result with a phase shift of π to that above. In other words, keeping two adjacent control signals active means that the phase of the output signal is set exactly half-way between the phases of the corresponding input signals. This means in general that the multiplexer of FIG. 7 is capable of producing output signals at a phase difference grid where the grid interval is a half of the phase difference between adjacent input signals: by first activating control signal C1 alone, a first output signal is produced. Thereafter activating also control signal C2 while keeping the control signal C1 activated causes the output phase to decline by π/8. Deactivating now control signal C1 while keeping C2 activated causes the output phase to decline another π/8 radians, as does a subsequent activation of C3 while keeping C2 activated. Rotationally repeating this model of alterations between one activated control signal and two adjacent activated control signal causes the output phase to regularly decline in steps of π/8 radians. Changing the direction of the rotational order of changes, i.e. activating first C1 alone, then C1 and C4 together, then C4 alone, then C4 and C3 together and so on would cause the output phase to regularly advance in steps of π/8 radians.

Let us now consider the prescaler of FIG. 5 from the viewpoint of obtainable overall divisor values. Above we showed that making no changes in the phase selector 403 causes the divisor value to be M×4×N. A phase shift of π/4 radians is one eighth of a whole rotation in a phase diagram. Causing the output phase of the phase selector 403 to change in steps of π/4 radians means that each change either delays or advances the output signal of the phase selector (and all signals derived from it) by an amount of time which is equal to one eighth of the period in the output signal of the phase selector. Since the latter is obtained from the period $T_0$ of the input signal $F_{in}$ by multiplying it by M×4, we may state that each change either delays or advances the output signal of the phase selector (and all signals derived from it) by $0.5\times M\times T_0$. A similar calculation shows that causing the output phase of the phase selector 403 to change in steps of π/8 radians instead means that each change either delays or advances the output signal of the phase selector (and all signals derived from it) by $0.25\times M\times T_0$.

Making one delaying change of π/4 radians in the phase selector per each period of the output signal $F_{out}$ of the prescaler means that the divisor used in the prescaler is M×4×N+0.5×M=M×(4×N+0.5). Making two changes of this kind per each period of the output signal $F_{out}$ of the prescaler means using a divisor M×(4×N+1), and in general we may say that making C delaying changes of π/4 radians in the phase selector per each period of the output signal $F_{out}$ of the prescaler means that a divisor value M×(4×N+C/2) is used. Following similar logic, making D advancing changes of π/4 radians in the phase selector per each period of the output signal $F_{out}$ of the prescaler means that a divisor value M×(4×N−D/2) is used. If, for some reason, we make C delaying changes and D advancing changes in the phase selector per each period of the output signal $F_{out}$ of the prescaler, each change having the absolute value of $\pi/4$ radians, the net effect is that a divisor $M \times (4 \times N+(C-D)/2)$ is used.

It is easily shown that making C delaying changes of $\pi/8$ radians in the phase selector per each period of the output signal $F_{out}$ of the prescaler means that a divisor value $M \times (4 \times N+C/4)$ is used, making D advancing changes of $\pi/8$ radians in the phase selector per each period of the output signal $F_{out}$ of the prescaler means that a divisor value $M \times (4 \times N-D/4)$ is used, and making C delaying changes and D advancing changes in the phase selector per each period of the output signal $F_{out}$ of the prescaler, each change having the absolute value of $\pi/8$ radians, the net effect is that a divisor $M \times (4 \times N+(C-D)/4)$ is used. For the sake of completeness we may note that should we make C1 delaying changes and D1 advancing changes in the phase selector per each period of the output signal $F_{out}$ of the prescaler, each change having the absolute value of $\pi/4$ radians, and C2 delaying changes and D2 advancing changes in the phase selector per each period of the output signal $F_{out}$ of the prescaler, each of these changes having the absolute value of $\pi/8$ radians, the net effect is that a divisor $M \times (4 \times N+(C1-D1)/2+(C2-D2)/4)$ is used.

Figure 8:
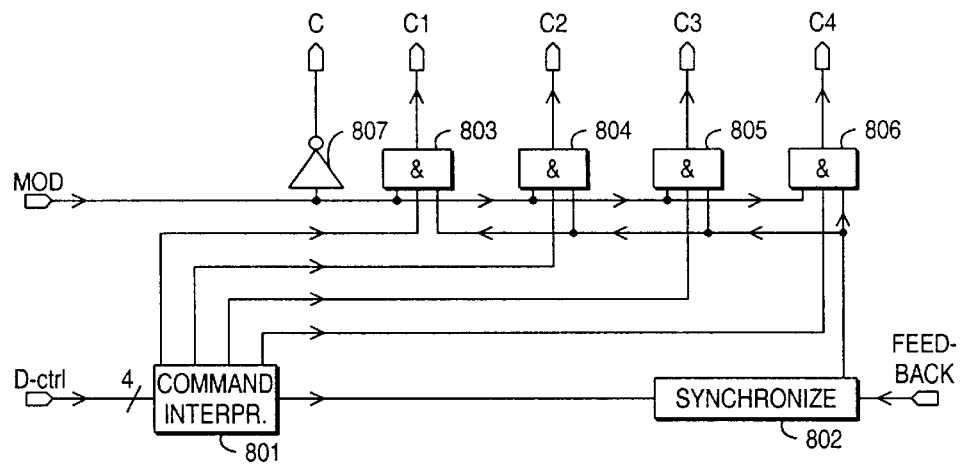
FIG. 8 illustrates a control block according to an embodiment of the invention.

FIG. 8 illustrates an exemplary functional block diagram of the control block 405. The 4-fold control instruction line goes into a command interpreter 801 which is arranged to obtain from a four-bit command word the knowledge regarding whether a forward (advance) or backward (decline) phase shift should be performed in the phase selector, whether the size of the shift should be $\pi/4$ or $\pi/8$ radians, and how many times per each period of the output signal $F_{out}$ of the prescaler should such a change be accomplished. The command interpreter 801 is additionally aware of which control signal(s) C1, C2, C3 or C4 is currently active. In order to appropriately synchronize the changes in activated command signal(s) with the output signal $F_{out}$ of the prescaler, there is a synchronization block 802 which is basically a controllable counter. It receives feedback from some stage of the post-dividing process. Additionally it receives from the command interpreter block 801 instructions regarding the number of times per period of the output signal $F_{out}$ of the prescaler a synchronization pulse is needed. From the command interpreter block 801 and the synchronization block 802 come signal lines to four parallel AND gates 803, 804, 805 and 806. Also from the enabling MOD input there comes a signal line to each AND gate.

When the MOD input is low, only a control signal C is given to the phase selector through the inverter 807 indicating that a constant connection between input and output of the phase selector should be made (the use of such a control signal is not shown in e.g. FIG. 7, but it is well within the capabilities of a person skilled in the art to make a corresponding modification). When the MOD input is high, all AND gates 803 to 806 are enabled. The command interpreter block 801 instructs the synchronizer block 802 to give a syncronization pulse C times per period of the output signal $F_{out}$ of the prescaler, and starts giving activation signals through the AND gates in the rotational order determined by the received instruction word. The synchronization pulses serve as triggering signals that cause the changes in control signals to occur exactly on time. Buffering (not shown in FIG. 8) is required between the AND gates and the phase selector block in order to keep the activated control signals active until the next change command given through the AND gates.

Figure 9:
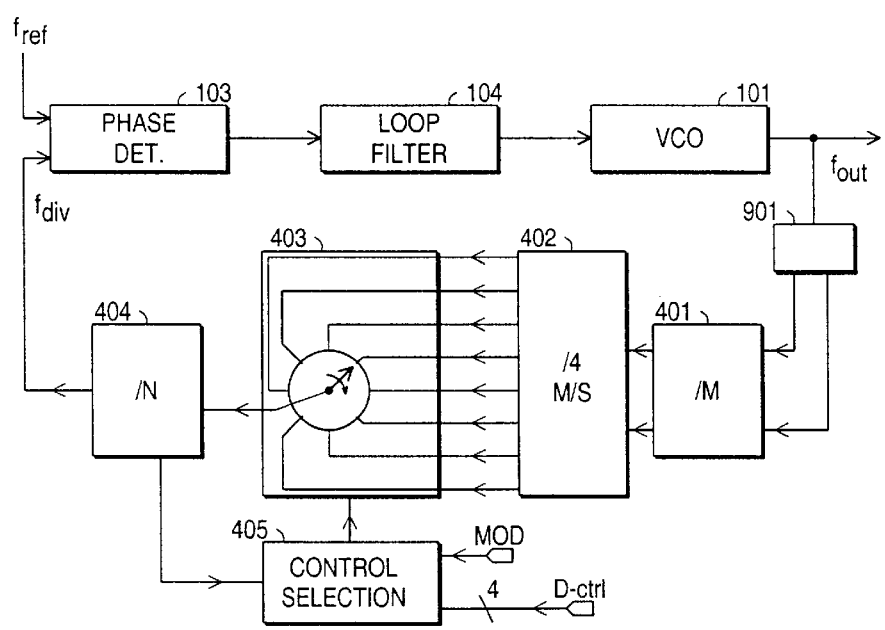
FIG. 9 illustrates a PLL frequency synthesizer according to an embodiment of the invention and FIG. 10 illustrates a method according to an embodiment of the invention.
Figure 10:
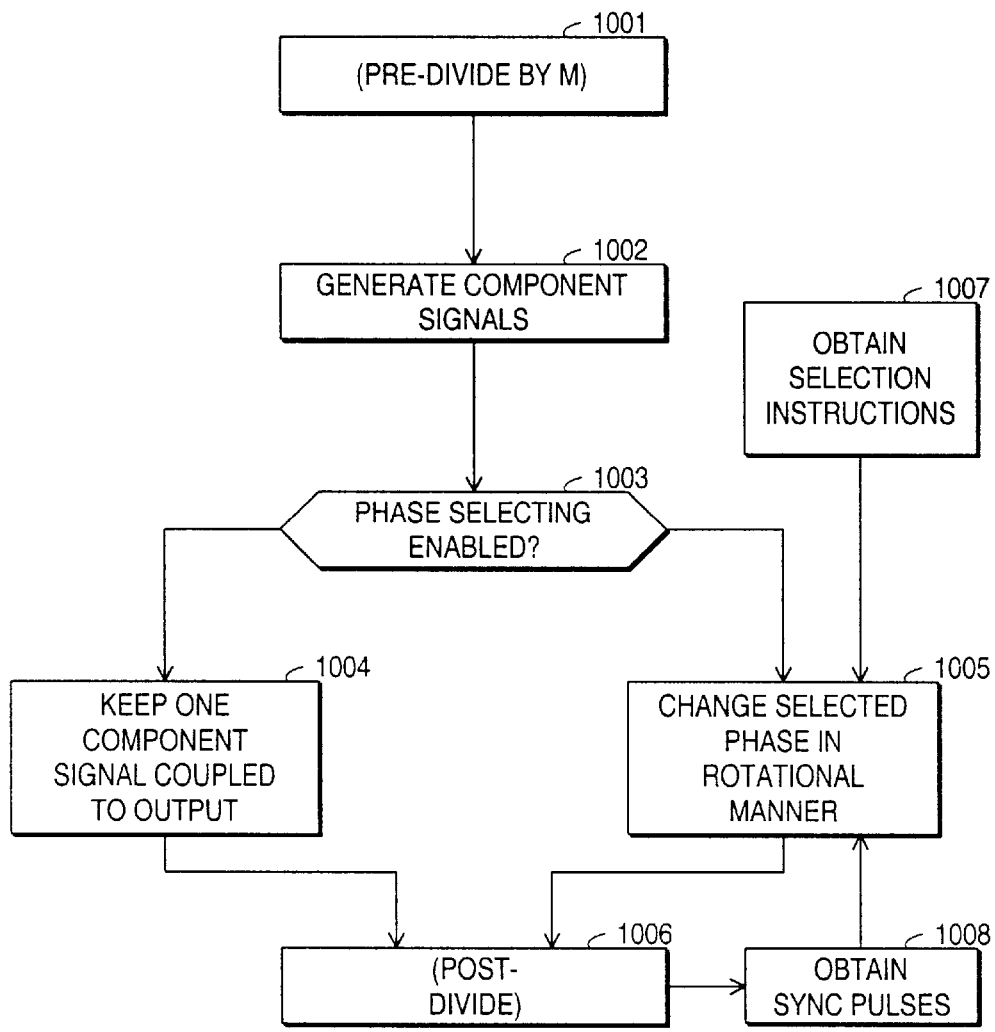

FIG. 9 illustrates the use of a prescaler according to FIG. 5 in a PLL application. If the output of the VCO 101 is not already in differential form, it can be differentiated in block 901; converting a unipolar signal into differential form is known to the person skilled in the art. This signal is fed into the prescaler, which accomplishes division by a certain divisor as instructed through the control input D-ctrl.

It should be noted that in a prescaler according to an invention it is perfectly possible to perform larger phase shifts than $\pi/4$ or $\pi/8$ radians with any one change of control signals to the phase selector. However, using large individual changes is usually not advantageous since they tend to cause the spike effect referred to in the description of prior art. The invention has the inherent feature of limiting the tendency of spiking, because small steps in changing the phase of the output of the phase selector inherently mean a smaller slope value for the curve representing the change.

The embodiments of the invention discussed above should not be construed to pose limitations to the applicability of the invention. For example, in the multiplexer structure of FIG. 7 it is easy to delete switching branches or add switching branches in parallel with the ones shown in FIG. 7 to obtain a multiplexer accepting less or more input and control signals.

What is claimed is:

1. A prescaler for generating an output frequency from an input frequency by fractional division, comprising:
    a component signal composer arranged to take an oscillating signal and to generate a number of parallel component signals that differ in phase from each other by dividing a frequency of said oscillating signal; and
    a controllable phase selector arranged to respond to a control signal by either selecting a constant number of unchanged ones of the parallel component signals or to repeatedly change its selection among the parallel component signals;
    wherein the component signal composer is arranged to generate more than four parallel component signals for the phase selector to choose from.

2. A prescaler according to claim 1, wherein the component signal composer is arranged to generate the parallel component signals at regular phase differences from each other.

3. A prescaler according to claim 1, wherein the component signal composer is arranged to generate an even number of parallel component signals so that the parallel component signals constitute a set of differential signal pairs.

4. A prescaler according to claim 3, wherein the number of parallel component signals is eight.

5. A prescaler for generating an output frequency from an input frequency by fractional division, comprising:
    a component signal composer arranged to take an oscillating signal and to generate a number of parallel component signals that differ in phase from each other by dividing said oscillating signal; and
    a controllable phase selector arranged to respond to a control signal by either selecting a constant number of unchanged ones of the parallel component signals or to repeatedly change its selection among the parallel component signals;
    wherein the component signal composer is arranged to generate more than four parallel component signals for the phase selector to choose from;
    the component signal composer is arranged to generate an even number of parallel component signals so that the parallel component signals constitute a set of differential signal pairs; and the component signal composer comprises an even number of differential D-flip-flops coupled in a master-slave configuration, so that the differential output of each differential Dflipflop constitutes a differential signal pair.

6. A prescaler according to claim 3, wherein the controllable phase selector comprises the capability of summing two selected parallel component signals from different differential signal pairs together.

7. A prescaler for generating an output frequency from an input frequency by fractional division, comprising:
   a component signal composer arranged to take an oscillating signal and to generate a number of parallel component signals that differ in phase from each other by dividing said oscillating signal; and
   a controllable phase selector arranged to respond to a control signal by either selecting a constant number of unchanged ones of the parallel component signals or to repeatedly change its selection among the parallel component signals;
   wherein the component signal composer is arranged to generate more than four parallel component signals for the phase selector to choose from;
   the component signal composer is arranged to generate an even number of parallel component signals so that the parallel component signals constitute a set of differential signal pairs; and
   the controllable phase selector comprises:
      a first loaded supply voltage rail,
      a second loaded supply voltage rail,
      a bias rail,
      coupled between said first loaded supply voltage rail and said bias rail a first number of switching branches,
      coupled between said second loaded supply voltage rail and said bias rail a second number of switching branches,
      within each switching branch the series connection of a pair of parallel switches and a serially coupled switch, of which a first switch in the pair of parallel switches is coupled between said first loaded supply voltage rail and said serially coupled switch, a second switch in the pair of parallel switches is coupled between said second loaded supply voltage rail and said serially coupled switch, and said serially coupled switch is coupled between said pair of parallel switches and said bias rail,
      a control coupling between the first component signal within each differential signal pair and a first switch in a pair of parallel switches associated with that differential signal pair, so that said first component signal is arranged to open and close said first switch,
      a control coupling between the second component signal within each differential signal pair and a second switch in a pair of parallel switches associated with that differential signal pair, so that said second component signal is arranged to open and close said second switch,
      a control coupling between each one of a number of control signals and the serially coupled switch in a pair of parallel switches associated with that one of the control signals, so that said one of the control signals is arranged to open and close said serially coupled switch, and
      an output connection from each of said first and second loaded supply voltage rails.

8. A frequency synthesizer for generating an oscillating output signal of a selected frequency, comprising:
   the series connection of a phase detector, a loop filter and a voltage controlled oscillator,
   a reference frequency input to the phase detector,
   an output from the voltage controlled oscillator for outputting the oscillating output signal; and
   a feedback connection from the output to the phase detector through a prescaler;
   wherein the prescaler comprises:
      a frequency divider composing component signals of and being arranged to take the oscillating output signal of the voltage controlled oscillator and to generate a number of parallel component signals that differ in phase from each other by dividing the oscillating output signal of the voltage controlled oscillator; and
      a controllable phase selector arranged to respond to a control signal by either selecting a constant number of unchanged ones of the parallel component signals or to repeatedly change its selection among the parallel component signals;
      wherein the component signal composer is arranged to generate more than four parallel component signals for the phase selector to choose from.

9. A method for generating an output frequency from an input frequency, comprising the steps of:
   generating through division of the input frequency, a number of parallel component signals that differ in phase from each other; and
   controllably either selecting a constant number of unchanged ones of the parallel component signals or repeatedly switching the selection among the component signals;
   wherein the step of generating a number of parallel component signals comprises the substeps of generating more than four parallel component signals, and dividing the input frequency.

10. A method according to claim 9, wherein the step of generating a number of parallel component signals comprises the substep of generating the parallel component signals at regular phase differences from each other.

11. A method according to claim 9, wherein step of generating a number of parallel component signals comprises the substep of generating an even number of parallel component signals so that the parallel component signals constitute a set of differential signal pairs.

12. A method according to claim 11, wherein the step of generating a number of parallel component signals comprises the substep of generating eight parallel component signals.

13. To from an input frequency, comprising the steps of:
   generating, on the basis of the input frequency, a number of parallel component signals that differ in phase from each other; and
   controllably either selecting a constant number of unchanged ones of the parallel component signals or repeatedly switching the selection among the component signals;
   wherein the step of generating a number of parallel component signals comprises the substep of generating more than four parallel component signals;
   the step of generating a number of parallel component signals comprises the substep of generating an even number of parallel component signals so that the parallel component signals constitute a set of differential signal pairs; and the step of controllably either selecting a constant number of unchanged ones of the parallel component signals or repeatedly switching the selection among the component signals comprises the substeps of:

when selecting a constant number unchanged ones of the parallel component signals, either selecting one differential pair or selecting two differential signal pairs and summing them so that a first component signal from the first differential signal pair is summed with a first component signal from the second differential signal pair and a second component signal from the first differential signal pair is summed with a second component signal from the second differential signal pair, and when repeatedly switching the selection among the component signals, either selecting one differential signal pair at a time or alternating between selecting one differential signal pair at a time and selecting two differential signal pairs and summing them so that a first component signal from the first differential signal pair is summed with a first component signal from the second differential signal pair and a second component signal from the first differential signal pair is summed with a second component signal from the second differential signal pair.

14. A method according to claim 9, comprising the step of synchronizing the switching of the selection among the component signals with periods in the output frequency so that a constant number of changes in selection are made per each complete period of the output frequency.

15. A method for generating an output frequency from an input frequency, comprising the steps of:

generating, on the basis of the input frequency, a number of parallel component signals that differ in phase from each other;

controllably either selecting a constant number of unchanged ones of the parallel component signals or repeatedly switching the selection among the component signals, wherein the step of generating a number of parallel component signals comprises the substep of generating more than four parallel component signals; and controllably dividing the input frequency by $M \times (4 \times N + (C1-D1)/2 + (C2-D2)/4)$, where M is a first positive integer, N is a second positive integer, C1 is the number of times per each period of the output frequency of changing the selection of component signal from a current component signal to a component signal delayed in phase from the current component signal by $\pi/4$ radians, D1 is the number of times per each period of the output frequency of changing the selection of component signal from a current component signal to a component signal advanced in phase from the current component signal by $\pi/4$ radians, C2 is the number of times per each period of the output frequency of changing the selection of component signal either from a current component signal to a sum of the current component signal and a component signal delayed in phase from the current component signal by $\pi/4$ radians or from the current sum of a first component signal and a second component signal delayed in phase from the first component signal by $\pi/4$ radians to solely the second component signal, and D2 is the number of times per each period of the output frequency of changing the selection of component signal either from a current component signal to a sum of the current component signal and a component signal advanced in phase from the current component signal by $\pi/4$ radians or from the current sum of a first component signal and a second component signal advanced in phase from the first component signal by $\pi/4$ radians to solely the second component signal.

16. A prescaler for generating an output frequency from a single input signal by fractional division of a frequency off the input signal, comprising:

a component signal composer operative on the single input signal, by dividing a frequency of the input signal, to generate multiple parallel component signals that differ in phase from each other; and a controllable phase selector operative to respond to a control signal by either selecting a constant number of unchanged ones of the parallel component signals or to repeatedly change its selection among the parallel component signals;

wherein the component signal composer includes a succession of phase shifting stages to generate more than four parallel component signals for selection by the phase selector.

* * * * *